(12) United States Patent
Adamovich et al.

(10) Patent No.: US 8,778,511 B2
(45) Date of Patent: Jul. 15, 2014

(54) OLED STABILITY VIA DOPED HOLE TRANSPORT LAYER

(75) Inventors: Vadim Adamovich, Yardley, PA (US); Brian D'Andrade, Westampton, NJ (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 393 days.

(21) Appl. No.: 13/139,227

(22) PCT Filed: Oct. 1, 2009

(86) PCT No.: PCT/US2009/059198
§ 371 (c)(1),
(2), (4) Date: Jun. 27, 2011

(87) PCT Pub. No.: WO2010/068330
PCT Pub. Date: Jun. 17, 2010

(65) Prior Publication Data
US 2011/0240984 A1    Oct. 6, 2011

Related U.S. Application Data

(60) Provisional application No. 61/121,991, filed on Dec. 12, 2008.

(51) Int. Cl.
*H01L 51/54* (2006.01)
(52) U.S. Cl.
USPC ........... 428/690; 428/917; 313/504; 313/505; 313/506; 257/40; 257/E51.05; 257/E51.026; 257/E51.03; 564/26; 564/426; 564/340

(58) Field of Classification Search
USPC .................. 428/690, 917; 313/504, 505, 506; 257/40, E51.05, E51.026, E51.032
See application file for complete search history.

(56) References Cited

U.S. PATENT DOCUMENTS

| 4,769,292 A | 9/1988 | Tang et al. |
| 5,061,569 A | 10/1991 | VanSlyke et al. |

(Continued)

FOREIGN PATENT DOCUMENTS

| EP | 0650955 | 5/1995 |
| EP | 1 017 118 | 7/2000 |

(Continued)

OTHER PUBLICATIONS

Chwang et. al., Graded mixed-layer organic light-emitting devices, 2002, Applied Physics Letters, vol. 80, No. 5, pp. 725-727.*

(Continued)

*Primary Examiner* — Gregory Clark
(74) *Attorney, Agent, or Firm* — Sterne, Kessler, Goldstein & Fox P.L.L.C.

(57) ABSTRACT

An organic light emitting device is provided. The device includes an anode and a cathode. A first organic layer is disposed between the anode and the cathode. The first organic layer is an emissive layer that includes a first organic emitting material. The device also includes a second organic layer disposed between the anode and the first organic layer. The second organic layer is a non-emissive layer. The second organic layer includes an organic small molecule hole transport material having a concentration of 50 to 99 wt %, and an organic small molecule electron transport material having a concentration of 0.1 to 5 wt %. Other materials may be present.

18 Claims, 6 Drawing Sheets

(56) References Cited

U.S. PATENT DOCUMENTS

| | | | |
|---|---|---|---|
| 5,247,190 A | 9/1993 | Friend et al. | |
| 5,703,436 A | 12/1997 | Forrest et al. | |
| 5,707,745 A | 1/1998 | Forrest et al. | |
| 5,773,130 A * | 6/1998 | So et al. | 428/195.1 |
| 5,834,893 A | 11/1998 | Bulovic et al. | |
| 5,884,363 A | 3/1999 | Tofts | |
| 5,955,836 A * | 9/1999 | Boerner et al. | 313/506 |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,687,266 B1 | 2/2004 | Ma et al. | |
| 6,803,720 B2 * | 10/2004 | Kwong et al. | 313/504 |
| 6,805,978 B2 * | 10/2004 | Murase et al. | 428/690 |
| 6,835,469 B2 | 12/2004 | Kwong et al. | |
| 7,087,321 B2 | 8/2006 | Kwong et al. | |
| 7,279,704 B2 | 10/2007 | Walters et al. | |
| 7,431,968 B1 | 10/2008 | Shtein et al. | |
| 2002/0034656 A1 | 3/2002 | Thompson et al. | |
| 2002/0134984 A1 | 9/2002 | Igarashi | |
| 2003/0175553 A1 | 9/2003 | Thompson et al. | |
| 2003/0230980 A1 | 12/2003 | Forrest et al. | |
| 2004/0142207 A1 * | 7/2004 | Wang | 428/690 |
| 2004/0174116 A1 | 9/2004 | Lu et al. | |
| 2005/0025993 A1 | 2/2005 | Thompson et al. | |
| 2005/0208331 A1 * | 9/2005 | Maeda | 428/690 |
| 2005/0260441 A1 | 11/2005 | Thompson et al. | |
| 2005/0260449 A1 | 11/2005 | Walters et al. | |
| 2005/0274961 A1 | 12/2005 | Iou | |
| 2006/0008670 A1 | 1/2006 | Lin et al. | |
| 2006/0051563 A1 | 3/2006 | Okumoto | |
| 2006/0202194 A1 | 9/2006 | Jeong et al. | |
| 2006/0251923 A1 | 11/2006 | Lin et al. | |
| 2006/0280965 A1 | 12/2006 | Kwong et al. | |
| 2007/0190359 A1 | 8/2007 | Knowles et al. | |

FOREIGN PATENT DOCUMENTS

| | | |
|---|---|---|
| JP | 200511610 | 1/2005 |
| JP | 2007123392 | 5/2007 |
| JP | 2007254297 | 10/2007 |
| WO | WO 0139234 | 5/2001 |
| WO | WO 0202714 | 1/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006082742 | 8/2006 |
| WO | WO 2006098120 | 9/2006 |
| WO | WO 2006103874 | 10/2006 |
| WO | WO 2006114966 | 11/2006 |
| WO | WO 2006132173 | 12/2006 |
| WO | WO 2007004380 | 1/2007 |
| WO | WO 2007063754 | 6/2007 |
| WO | WO 2007063796 | 6/2007 |

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Tung, Yung-Liang et al., "Organic Light-Emitting Diodes Based on Charge-Neutral $Ru^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Wong, Wai-Yeung, "Multifunctional Iridium Complexes Based on Carbazole Modules as Highly Efficient Electrophosphors," Angew. Chem. Int. Ed., 45:7800-7803 (2006).

Tang, C.W. and VanSlyke, S.A., "Organic Electroluminescent Diodes," Appl. Phys. Lett., 51(12):913-915 (1987).

Adachi, Chihaya et al., "Organic Electroluminescent Device Having a Hole Conductor as an Emitting Layer," Appl. Phys. Lett., 55(15):1489-1491 (1989).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Gao, Zhiqiang et al., "Bright-Blue Electroluminescence From a Silyl-Substituted ter-(phenylene-vinylene) derivative," Appl. Phys. Lett., 74(6):865-867 (1999).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Hung, L.S. et al., "Anode Modification in Organic Light-Emitting Diodes by Low-Frequency Plasma Polymerization of $CHF_3$," Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Wang, Y. et al., "Highly Efficient Electroluminescent Materials Based on Fluorinated Organometallic Iridium Compounds," Appl. Phys. Lett., 79(4):449-451 (2001).

Kwong, Raymond C. et al., "High Operational Stability of Electrophosphorescent Devices," Appl. Phys. Lett., 81(1):162-164 (2002).

Holmes, R.J. et al., "Blue Organic Electrophosphorescence Using Exothermic Host-Guest Energy Transfer," Appl. Phys. Lett., 82(15):2422-2424 (2003).

Sotoyama, Wataru et al., "Efficient Organic Light-Emitting Diodes with Phosphorescent Platinum Complexes Containing N^C^N--Coordinating Tridentate Ligand," Appl. Phys. Lett., 86:153505-1-153505-3 (2005).

Okumoto, Kenji et al., "Green Fluorescent Organic Light-Emitting Device with External Quantum Efficiency of Nearly 10%," Appl. Phys. Lett., 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Aonuma, Masaki et al., "Material Design of Hole Transport Materials Capable of Thick-Film Formation in Organic Light Emitting Diodes," Appl. Phys. Lett., 90:183503-1-183503-3 (2007).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

Adachi, Chihaya et al., "High-Efficiency Red Electrophosphorescence Devices," Appl. Phys. Lett., 78(11):1622-1624 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Hamada, Yuji et al., "High Luminance in Organic Electroluminescent Devices with Bis(10-hydroxybenzo[h]quinolinato)beryllium as an Emitter," Chem. Lett., 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4):592-593 (2005).

(56) References Cited

OTHER PUBLICATIONS

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylboryl)-2,2'-bithiophene and 5,5"-Bis(dimesitylbory1)-2,2':5',2"-terthiophene as a Novel Family of Electron-Transporting Amorphous Molecular Materials," *J. Am. Chem. Soc.*, 120 (37):9714-9715 (1998).

Sakamoto,Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15 ):2160-2162 (1996).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

The Search Report corresponding to the PCT/US2009/059198 application.

Chwang Anna B et al.: "Graded mixed-layer organic light-emitting devices" 15, 16, Applied Physics Letters, AIP, American Institute of Physics, vol. 80, No. 5, Feb. 4, 2002, pp. 725-727.

Yamamori Asuka et al.: "Doped organic light emitting diodes having a 650-nm-thick hole transport layer" Applied Physics Letters, American Institute of Physics, vol. 72, No. 17, Apr. 27, 1998, pp. 2147-2149.

Lee Jun et al: "The effect of C60 doping on the device performance of organic light-emitting diodes" Applied Physics Letters, American Institute of Physics, vol. 86, No. 6, Feb. 4, 2005, pp. 63514-063514.

Bera et al: "Red-emitting organic electroluminescent devices with tetraphenylchlorin doped into a hole-transporting material" Japanese Journal of Applied Physics, Japan, vol. 41, No. 4A, .Part 02, Apr. 1, 2002, pp. L391-L393.

Baldo et al., "Highly Efficient Phosphorescent Emission from Organic Electroluminescent Devices," Nature, vol. 395, 151-154, 1998; ("Baldo-I").

Baldo et al., "Very high-efficiency green organic light-emitting devices based on electrophosphorescence," Appl. Phys. Lett., vol. 75, No. 3, 4-6 (1999) ("Baldo-II").

* cited by examiner

OLED STABILITY VIA DOPED HOLE TRANSPORT LAYER

This application claims priority to and benefit under 35 U.S.C. §119(e) to International Application No. PCT/US2009/059198 filed Oct. 1, 2009 and to U.S. Provisional Application No. 61/121,991, filed Dec. 12, 2008, the disclosures of which are herein expressly incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and improved architectures for such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

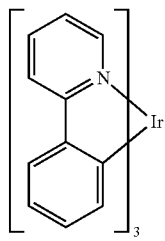

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

An organic light emitting device is provided. The device includes an anode and a cathode. A first organic layer is disposed between the anode and the cathode. The first organic layer is an emissive layer that includes a first organic emitting material. The device also includes a second organic layer disposed between the anode and the first organic layer. The second organic layer is a non-emissive layer. The second organic layer includes an organic small molecule hole transport material having a concentration of 50 to 99 wt %, and an organic small molecule electron transport material having a concentration of 0.1 to 5 wt %. Other materials may be present.

Preferably, the organic small molecule electron transport material has a concentration of 0.1 to 4 wt % in the second organic layer, and more preferably a concentration of 2 to 4 wt %. Even more preferably, the organic small molecule electron transport material has a concentration of 0.1 to 3 wt % in the second organic layer, and more preferably a concentration of 2 to 3 wt %. Preferably, the second organic layer is in direct contact with the first organic layer.

In one embodiment, the device also includes a third organic layer disposed between the second organic layer and the anode, where the third organic layer includes a hole injection material. In one embodiment, the third organic layer is in direct contact with the anode and the second organic layer.

In one embodiment, the device also includes a fourth organic layer disposed between the first organic layer and the cathode, where the fourth organic layer is an emissive layer that includes a second emitting material.

In one embodiment, the device also includes a fifth organic layer disposed between the second organic layer and the anode, where the fifth organic layer includes the organic small molecule hole transport material, and does not include the organic small molecule electron transport material.

In one embodiment, the organic small molecule electron transport material has a HOMO-LUMO difference that is at least 0.2 eV less than the HOMO-LUMO difference of the organic small molecule hole transport material.

In one embodiment, the organic small molecule electron transport material has a LUMO energy level that is at least 0.2 eV less than the LUMO energy level of the organic small molecule hole transport material.

Preferably, the first organic emitting material is phosphorescent.

In one embodiment, the emitting material has a peak emissive wavelength in the visible spectrum of 600 to 700 nm. In another embodiment, the emitting material has a peak emissive wavelength in the visible spectrum of 500 to 600 nm. In another embodiment, the emitting material has a peak emissive wavelength in the visible spectrum of 400 to 500 nm.

A preferred class of materials for the organic small molecule electron transport material are the metal quinolates. $Alq_3$ is a preferred metal quinolate. LG201 is also a preferred organic small molecule electron transport material.

A preferred class of materials for the organic small molecule hole transport material are amine-containing materials. NPD is a preferred amine-containing material.

Preferably, the organic small molecule electron transport material has an electron mobility higher than that of the organic small molecule hole transport material.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
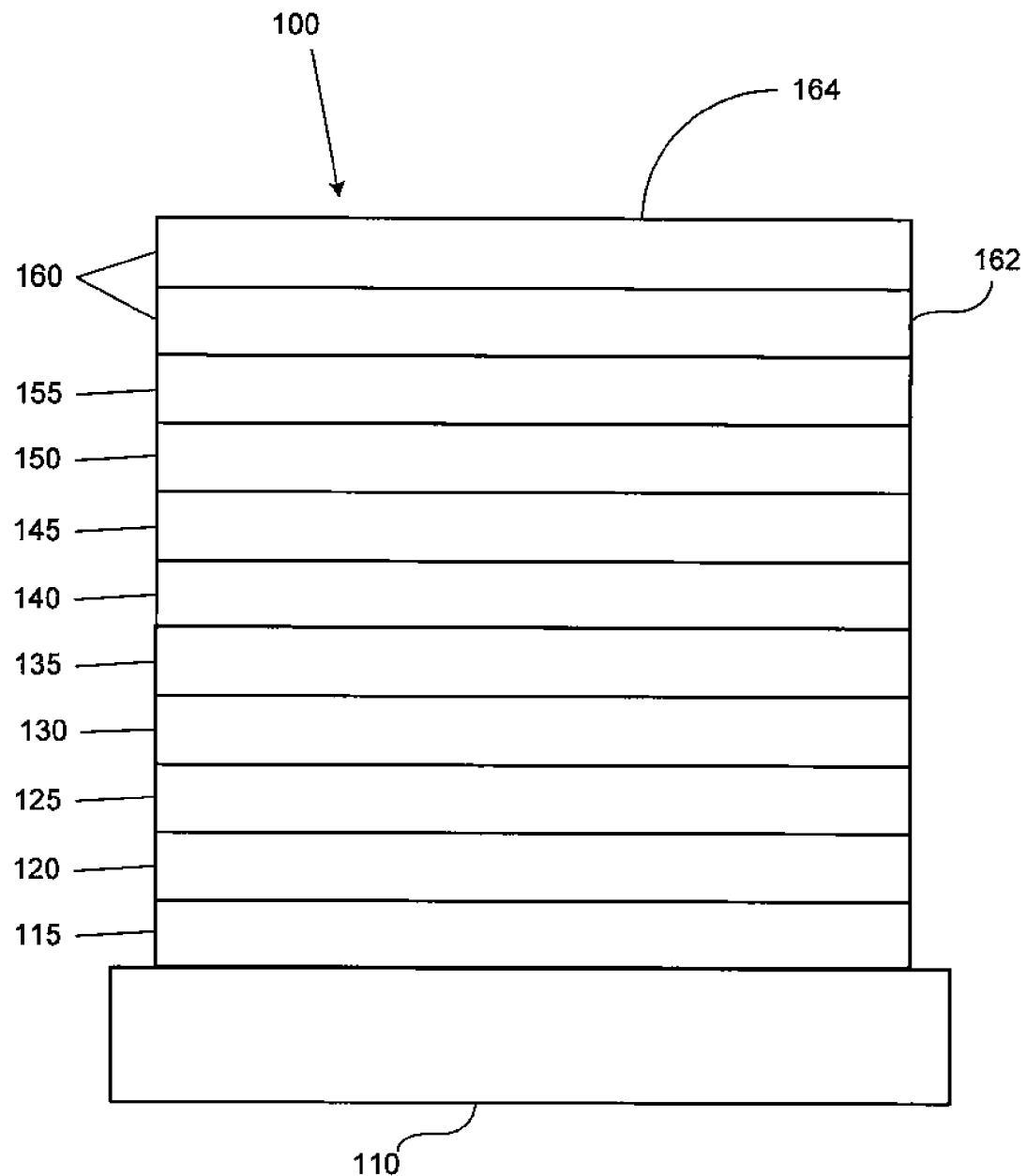
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
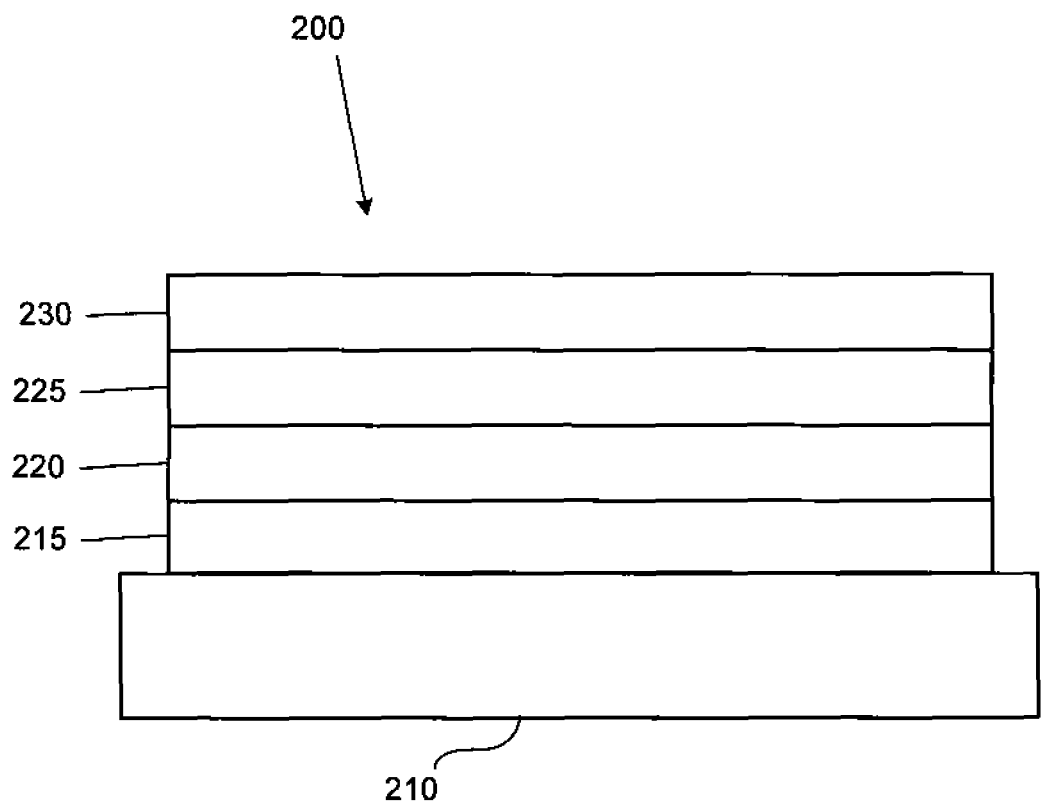
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety.

By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures.

More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

An organic light emitting device is provided. The device includes an anode and a cathode. A first organic layer is disposed between the anode and the cathode. The first organic layer is an emissive layer that includes a first organic emitting material. The device also includes a second organic layer disposed between the anode and the first organic layer. The second organic layer is a non-emissive layer. The second organic layer includes an organic small molecule hole transport material having a concentration of 50 to 99 wt %, and an organic small molecule electron transport material having a concentration of 0.1 to 5 wt %. Other materials may be present.

Using the structure described, OLED lifetime was improved by more than 2 times relative to a device not including the organic small molecule electron transport material in the second organic layer. The second organic layer is closer to the anode than the emissive layer, and therefore transports holes to the emissive layer. It is somewhat counterintuitive to introduce an electron transport material into this layer in significant quantities, because the electron transport material would be expected to, and in fact does in many situations, undesirably raise the operating voltage of the device because it dilutes the hole transport material. However, when used in the correct concentration in a small molecule organic device, this undesirable rise in operating voltage is more than offset by a desirable increase in device lifetime. The concentrations of 0.1 to 5 wt %, with preferred ranges of 0.1 to 4 wt %, 2 to 4 wt %, and more preferably 0.1 to 3 wt %, and more preferably 2 to 3 wt % for the organic small molecule electron transport material in the second organic layer are ranges where the tradeoff between increased device lifetime and increased operating voltage is expected to be highly favorable for a wide range of materials.

Without being limited to any theory as to why some embodiments of the invention work, it is believed that many common and otherwise highly desirable hole transport materials are vulnerable to damage from electrons and/or excitons. While these hole transport materials are generally used on the anode side of a device, where hole transport is the primary transport mechanism and electrons and excitons should be relatively rare, it is believed that a relatively low concentration of electrons or excitons can, over time, damage enough hole transport molecules to significantly decrease device lifetime. For example, it is believed that an electron concentration that is $10^6$ smaller than the hole concentration can result in such damage.

One specific failure mechanism may be the formation of excitons on hole transport materials due to electron or exciton leakage to HTL from adjacent EML layer. Electrons can recombine with holes on hole transport molecules and form an exciton. The use of an electron transport material as a dopant in the hole transport layer, where the electron transport material has a lower emission energy than the hole transport material, and also where the emission spectra of the hole transport and electron transport materials overlap, allows for energy transfer from the hole transport material to the electron transport material. In this situation, the hole transport material can relax to ground state as an exciton forms on the electron transport material. The presence of excitons on the electron transport material is not as destructive to device stability as the presence of excitons on the hole transport material. The excitons on the electron transport material can subsequently decay, preferably non-radiatively, although a small amount of radiative decay may be tolerated so long as it does not significantly affect the device spectra.

Another specific failure mechanism may be the formation of excited state hole transport material charged molecules (radical anions or polarons) due to leakage of electrons into the hole transport layer from the emissive layer and/or absorption of light. In this case, an anionic state of the hole transport material may be destructive for the device. An electron transport material present in the hole transport layer may transport electrons thorough the hole transport layer and prevent recombination of holes and electrons on hole transport material molecules. Preferably, the electron transport material has a lower LUMO energy than the hole transport material, by at least 0.2 eV, to ensure that electrons in the hole transport layer preferentially move to and stay on the electron transport material.

For example, triarylamine hole transport materials are believed to be degraded in some devices by leakage of electrons and excitons from the emissive layer, which causes overall device degradation during operation.

The introduction of a small amount of electron transport material, which may also quench excitons, may be useful. $Alq_3$ is an example of such a material. Improvement in device lifetime may be attributed to the quenching of NPD excited state molecules formed due to electrons or excitons leakage into an NPD HTL from the EML interface. Another mechanism that may be responsible for improved lifetime is transport of excessive electrons through the hole transport layer, such as NPD, by an electron transport material, such as $Alq_3$, avoiding recombination of holes and electrons on the same. NPD molecules. In order to take advantage of this transport mechanism it is preferred that there is a single hole transport layer that extends all the way from the emissive layer to the anode, or perhaps to a hole injection layer, and that the electron transport material is present all the way across the hole transport material. However, in some embodiments, there may be a hole transport layer that does not include the electron transport material, in addition to a hole transport layer that does include an electron transport layer. In this instance, only the device lifetime may still be improved as it is believed that, in many devices, degradation of molecules within or immediately adjacent to the emissive layer can be the most influential on the device lifetime.

The introduction of a small amount of electron transport material in a hole transport layer, in preferred concentrations, has been shown to improve device lifetime with little effect on device spectra and voltage-efficiency characteristics. The idea was tested in green and red phosphorescent OLEDs with an NPD HTL doped with 2 to 10% of Alq. Alq was selected as the electron transport material because it has a lower exited state energy than NPD and readily accepts excitons from NPD. Alq also can transport excessive electrons (leaked from the EML) through the HTL to avoid electron damage to the NPD HTL. However, it is believed that a wide range of combinations of hole transport and electron transport materials will show similar results. The results of the tests showed that concentrations of 5 wt % or less, and preferably 4 wt % and more preferably 3 wt % or less, are preferred to avoid undesirable effects that occur when the concentration of electron transport material in the hole transport layer becomes too high.

Preferably, the second organic layer is in direct contact with the first organic layer. The non-emissive layer immediately on the anode side of the emissive layer, i.e., the non-emissive layer in contact with the emissive layer, is where, on the anode side of the emissive layer, electron concentration is expected to be highest. This is the layer that can benefit most from the presence of an electron transport material in small concentrations.

Amine-containing materials are any organic material that include an amine group. Amine-containing materials are a class of desirable hole transport materials for OLEDs, due to their good hole transport properties. Triarylamines, and particularly NPD, are preferred amine-containing materials, and are used as hole transport materials in many OLED architectures. However, amine containing materials are susceptible to damage from electrons and excitons as described above. NPD and other triarylamine hole transport materials are believed to be particularly chemically unstable in the excited state (anionic state or exciton state), which may be a significant reason for shorter lifetimes in devices using triarylamine hole transport materials. Amine-containing materials are preferred hole transport materials for use in some embodiments of the invention.

Metal quinolates are a class of desirable electron transport materials for OLEDs, due to their good electron transport properties. $Alq_3$ is a preferred metal quinolate, and is used as an electron transport material in many OLED architectures. Metal quinolates are preferred electron transport materials for use in some embodiments of the invention.

By "non-emissive," it is meant that a layer contributes insignificantly to the emission of the device. By "non-emitting," it is meant that a material does not emit significantly in the device, although it may be emissive in other contexts. One way to measure whether an electron transport dopant in a non-emissive hole transport layer is "non-emitting" is via measuring the shift in the 1931 CIE coordinates of the doped device relative to a control device. For example, if a device having a particular electron transport dopant in a hole transport layer has 1931 CIE coordinates that are within (0.005, 0.005) of an otherwise identical device that does not have the dopant, the dopant can be considered "non-emitting." Preferably any shift in the 1931 CIE coordinates would be less than (0.003, 0.003). It is believed that many electron transport materials, if doped into a hole transport layer, may undesirably result in emission from that layer, and/or higher operating voltages, if the ranges are higher than those disclosed herein. Preferably, the concentration of small molecule organic electron transport material in the second organic layer is 5 wt % or less, preferably 4 wt % or less, and more preferably 3 wt % or less.

In one embodiment, the device also includes a third organic layer disposed between the second organic layer and the anode, where the third organic layer includes a hole injection material. In one embodiment, the third organic layer is in direct contact with the anode and the second organic layer. The third organic layer may act as a hole injection layer, which readily accepts holes from an anode and injects them into the rest of the device.

In one embodiment, the device also includes a fourth organic layer disposed between the first organic layer and the cathode, where the fourth organic layer is an emissive layer that includes a second emitting material. The use of such a fourth organic layer favorably allows for the use of multiple emissive materials in the OLED, which can be used to create OLEDs having broad emission spectra and/or white light.

In one embodiment, the device also includes a fifth organic layer disposed between the second organic layer and the anode, where the fifth organic layer includes the organic small molecule hole transport material, and does not include the organic small molecule electron transport material. Because the organic small molecule electron transport material is not present everywhere that the organic small molecule hole transport material is present, this embodiment is most useful in situations where it is believed that the predominant favorable effect of the small molecule electron transport material in the hole transport layer is due to the electron transport material acting as a recombination site for electrons, as opposed to transporting electrons through the hole transport layer. By limiting the presence of the small molecule organic electron transport material to a region near the emissive layer, any deleterious effect of the small molecule organic electron transport material on device operating voltage may be further minimized.

In one embodiment, the organic small molecule electron transport material has a HOMO-LUMO difference that is at least 0.2 eV less than the HOMO-LUMO difference of the organic small molecule hole transport material. The smaller HOMO-LUMO difference of the organic small molecule electron transport material may allow the organic small molecule electron transport material to readily accept excitons from the organic small molecule hole transport material, whereas exciton transfer in the opposite direction may be a less common event. It is believed that the presence of an exciton on the organic small molecule electron transport material is much less detrimental to device performance than the presence of an exciton on the organic small molecule hole transport material.

In one embodiment, the organic small molecule electron transport material has a LUMO energy level that is at least 0.2 eV less than the LUMO energy level of the organic small molecule hole transport material. The lower LUMO energy level of the organic small molecule electron transport material may allow the organic small molecule electron transport material to readily accept electrons from the organic small molecule hole transport material, or accept any electrons that leak from the emissive layer into the hole transport layer in preference to the organic small molecule hole transport material. It is believed that the presence of an electron on the organic small molecule electron transport material is much less detrimental to device performance than the presence of an electron on the organic small molecule hole transport material.

Preferably, the first organic emitting material is phosphorescent. The architectures disclosed herein may be particularly useful in conjunction with devices that use phosphorescent emitters as opposed to fluorescent emitters. In general, phosphorescent emitters have exciton lifetimes that are significantly greater than exciton lifetimes in fluorescent devices. As a result, there may be more opportunities in a phosphorescent device for excitons to move from molecule to molecule, and to leak into adjacent layers, such as a hole transport layer. Thus, one of the problems addressed by the use of an organic small molecule electron transport material in a hole transport layer may be much more prevalent in phosphorescent devices.

In one embodiment, the emitting material has a peak emissive wavelength in the visible spectrum of 600 to 700 nm. In another embodiment, the emitting material has a peak emissive wavelength in the visible spectrum of 500 to 600 nm. In another embodiment, the emitting material has a peak emissive wavelength in the visible spectrum of 400 to 500 nm. One favorable aspect of the concentrations disclosed herein for the use of a organic small molecule electron transport material in a hole transport layer is that the organic small molecule electron transport layer is unlikely to emit significantly. Many preferred organic small molecule electron transport materials, such as $Alq_3$, may emit under some circumstances. $Alq_3$ in particular emits green light. The emission of green light from a material that is not the intended emitting material in a device that is otherwise intended to emit green light may not be too detrimental. However, in devices in which the intended emitting material emits red or blue light, the emission of green light from a material in a transport layer is highly undesirable.

A preferred class of materials for the organic small molecule electron transport material are the metal quinolates. $Alq_3$ is a preferred metal quinolate. LG201 is also a preferred organic small molecule electron transport material.

A preferred class of materials for the organic small molecule hole transport material are amine-containing materials. NPD is a preferred amine-containing material.

Preferably, the organic small molecule electron transport material has an electron mobility higher than that of the organic small molecule hole transport material. Those of skill in the art generally know whether a material is a good electron transporter or a good hole transporter. While there are a few materials that are ambipolar, and can transport electrons and holes, most commonly used materials are either good electron transporters or good hole transporters. One measure of whether a material is an electron transport material or a hole transport material is the electron and hole mobility of a layer made of the material. A layer of an electron transport material generally has an electron mobility at least an order of magnitude higher than its hole mobility. Another way to measure whether a material is an electron transport material is to build several similar devices using the material in an electron transport layer. The devices are identical, except for different thicknesses of the electron transport layer. By measuring and comparing the current voltage characteristics of the devices, the electron transport properties of the electron transport material may be quantified. In addition, many commonly known families of electron transport materials are described in Table 1.

Figure 3:
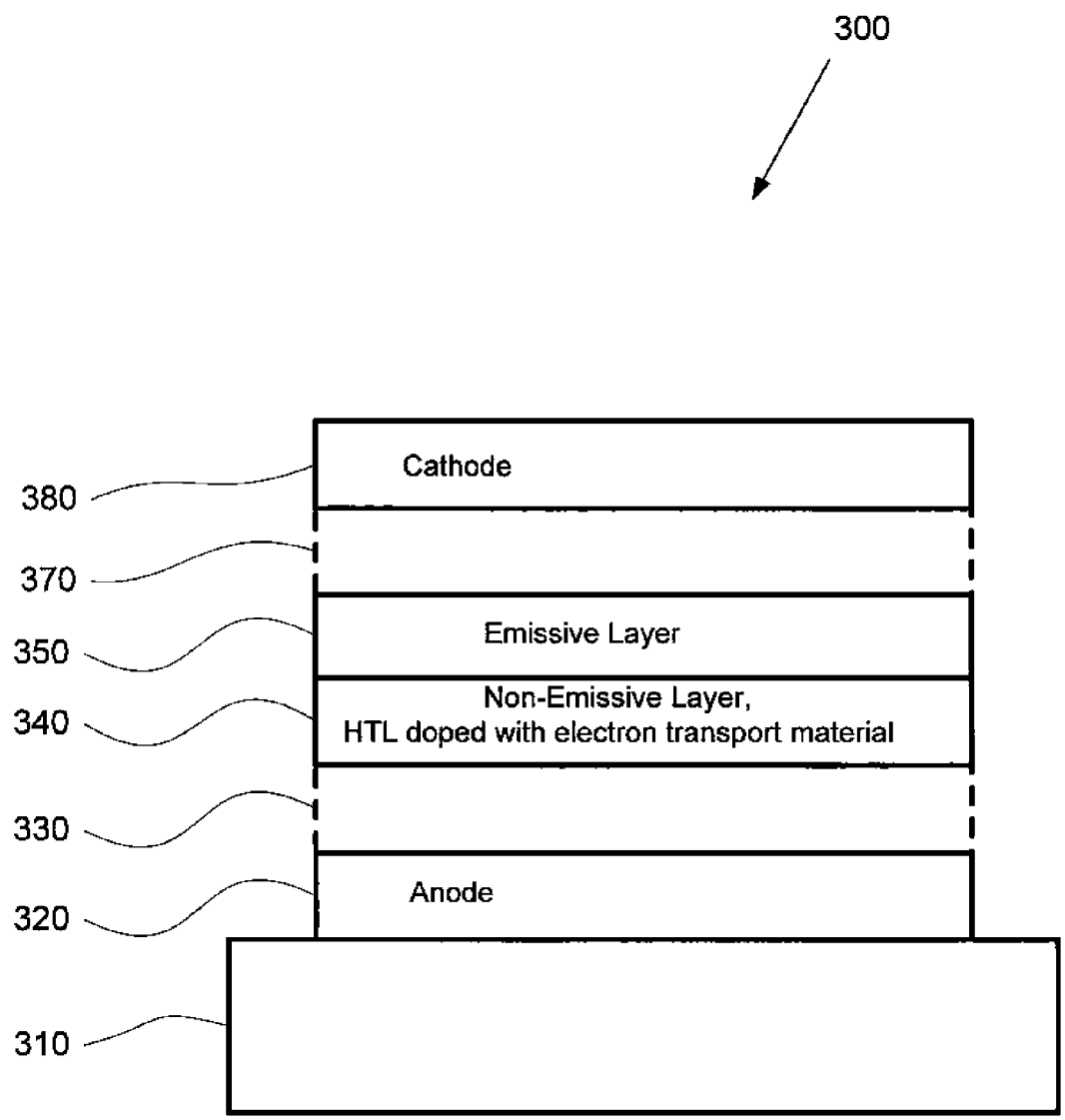
FIG. 3 shows an organic light emitting device having a non-emissive layer doped with an electron transport material.

FIG. 3 shows a device 300 having a non-emissive layer that is a hole transport layer doped with an electron transport material. Device 300 includes an anode 320 and a cathode 380. First organic layer 350, which is an emissive layer that comprises a first organic emitting material, is disposed between anode 320 and cathode 380. Second organic layer 340, which is a non-emissive layer, comprises an organic small molecule hole transport material doped with an organic small molecule electron transport material. Second organic layer 340, located between anode 320 and first organic layer 350, is a hole transport layer. Device 300 also optionally includes other layers 330 and 370, which may be any of the various organic layers used in an OLED in the positions illustrated. For example, layer 370 may represent one or more of a hole and/or exciton blocking layer, an electron transport layer, and an electron injection layer. For example, layer 370 may represent one or more of a hole transport layer in addition to second organic layer 340 and a hole injection layer. Examples of such layers are illustrated in FIGS. 1 and 2. Other types of layers may also be present.

Figure 4:
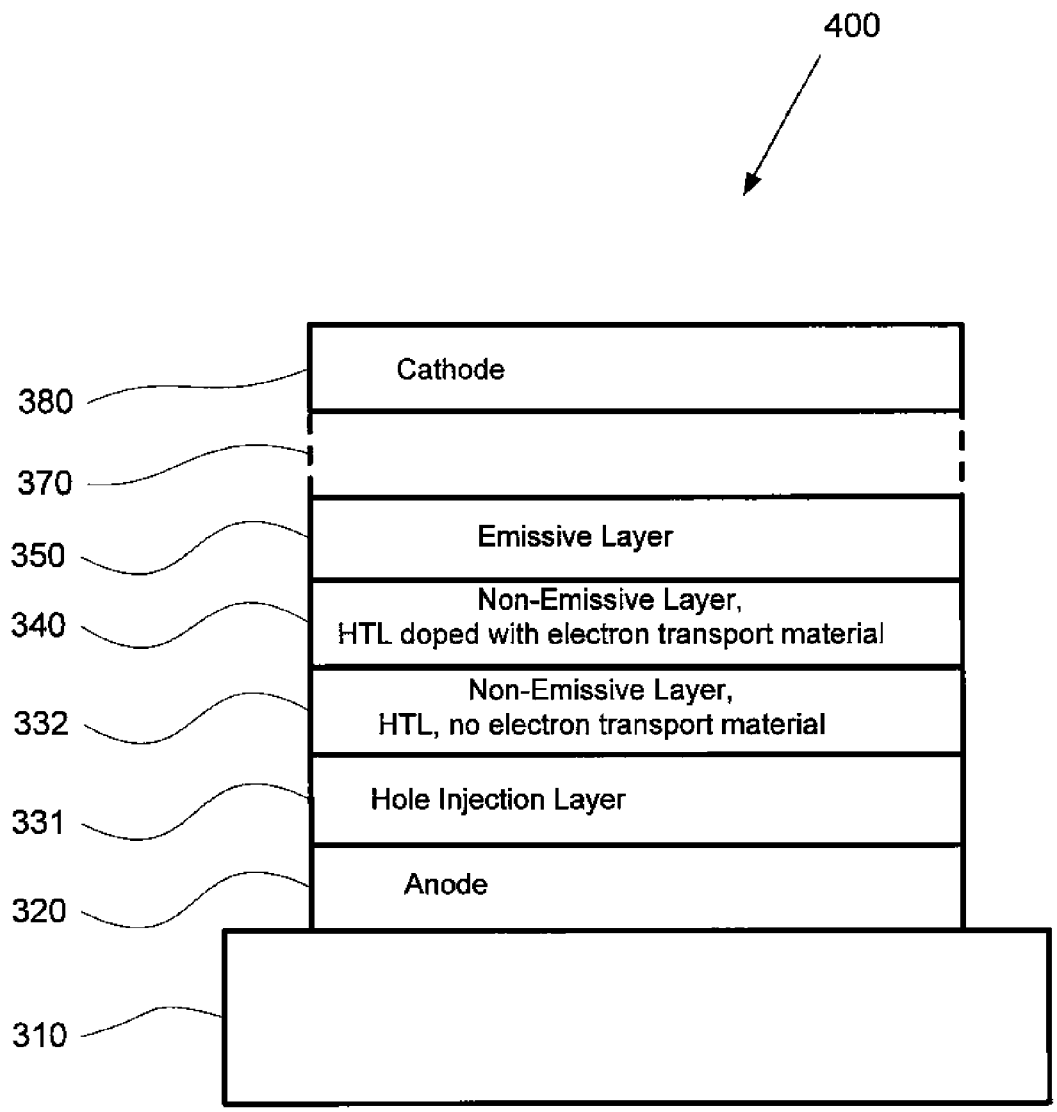
FIG. 4 shows an organic light emitting device having a non-emissive layer doped with an electron transport material, and other specific layers.

FIG. 4 shows a device 400. Device 400 is similar to device 300, and similarly includes anode 320, cathode 380, first organic layer 350, and second organic layer 340. Device 400 further illustrates layer 330 of device 300. Specifically, Device 400 includes a hole injection 331 and a hole transport layer 332 disposed, in that order, over anode 320. Hole transport layer 332 preferably includes the same small molecule hole transport material as second organic layer 340, but, in contrast to second organic layer 340, hole transport layer 332 does not include an electron transport material.

Figure 5:
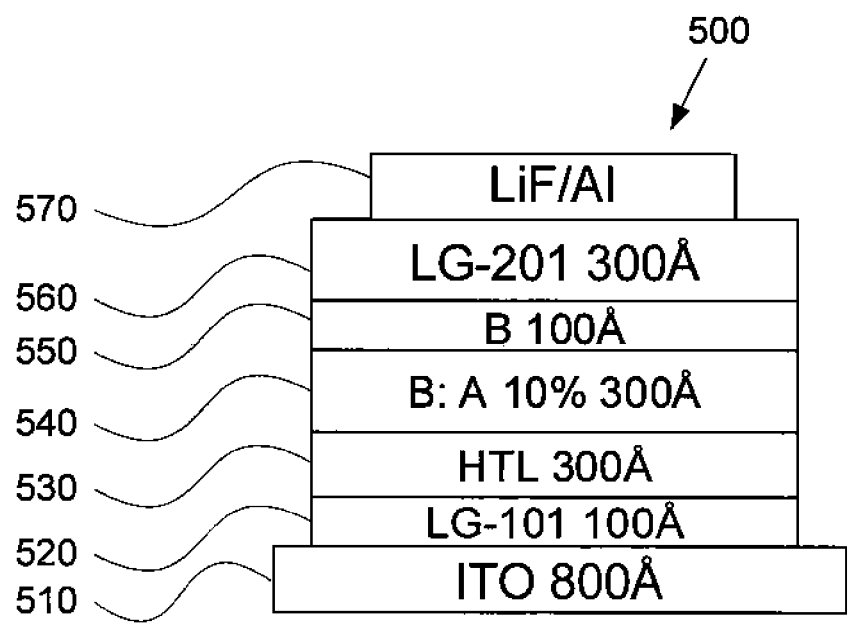
FIG. 5 shows a particular organic light emitting device structure having a non-emissive layer doped with an electron transport material.

FIG. 5 shows a device 500. Device 500 illustrates specific layers and material choices that were used in experiments relating to a green emitting device. Device 500 includes an anode 510 that is an 800 Å thick layer of ITO, a hole injection layer 520 that is a 100 Å thick layer of LG-101, a hole transport layer 530 that is 300 Å thick, an emissive layer 540 that is a 300 Å thick layer of Compound B doped with 10 wt % Compound A, an electron transport layer 550 that is a 100 Å thick layer of Compound A, another electron transport layer 560 that is a 300 Å thick layer of LG-201, and a cathode 570 that is LiF/Al. Compound A is a green phosphorescent emitting material in device 500.

Figure 6:
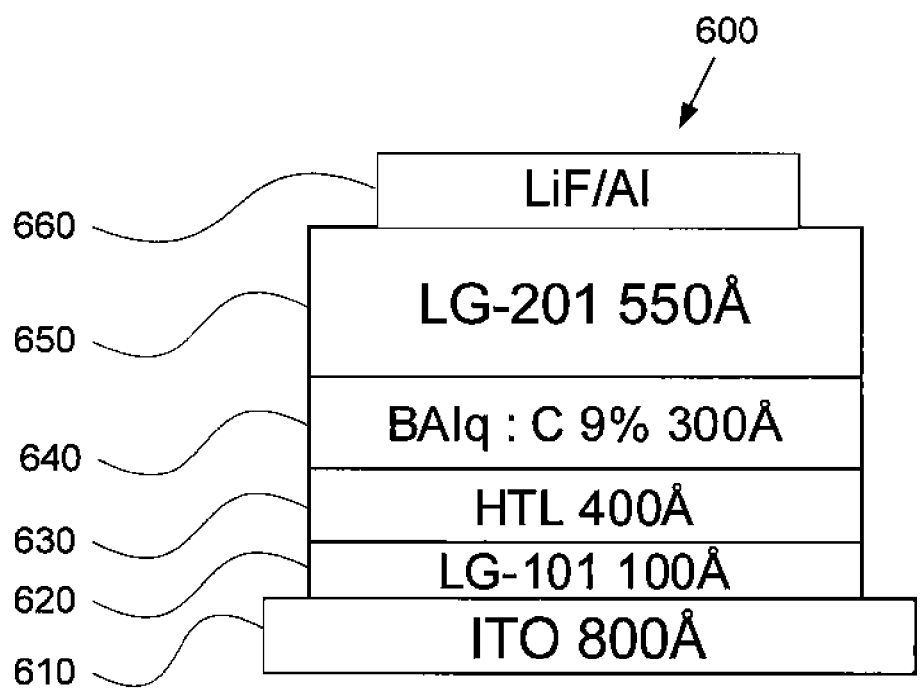
FIG. 6 shows a particular organic light emitting device structure having a non-emissive layer doped with an electron transport material.

FIG. 6 shows a device 600. Device 600 illustrates specific layers and material choices that were used in experiments relating to a red emitting device. Device 600 includes an anode 610 that is an 800 Å thick layer of ITO, a hole injection layer 620 that is a 100 Å thick layer of LG-101, a hole transport layer 630 that is 400 Å thick, an emissive layer 640 that is a 300 Å thick layer of BAlq B doped with 9 wt % Compound C, another electron transport layer 650 that is a 550 Å thick layer of LG-201, and a cathode 660 that is LiF/Al. Compound C is a red phosphorescent emitting material in device 600.

Figure 7:
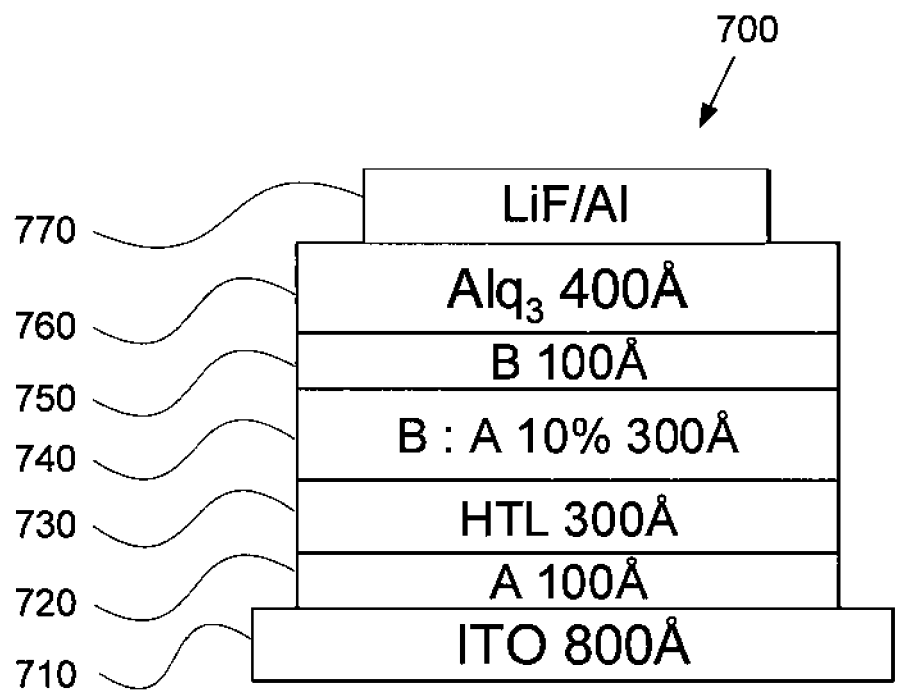
FIG. 7 shows a particular organic light emitting device structure having a non-emissive layer doped with an electron transport material.

FIG. 7 shows a device 700. Device 700 illustrates specific layers and material choices that were used in experiments relating to a green emitting device. Device 700 includes an anode 710 that is an 800 Å thick layer of ITO, a hole injection layer 720 that is a 100 Å thick layer of Compound A, a hole transport layer 730 that is 300 Å thick, an emissive layer 740 that is a 300 Å thick layer of Compound B doped with 10 wt % Compound A, an electron transport layer 750 that is a 100 Å thick layer of Compound B, another electron transport layer 760 that is a 400 Å thick layer of $Alq_3$, and a cathode 770 that is LiF/Al. Compound A is a green phosphorescent emitting material in device 700.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| Hole injection materials | | |
| Phthalocyanine and porphryin compounds | (Cu phthalocyanine structure) | Appl. Phys. Lett. 69, 2160 (1996) |
| Starburst triarylamines | (starburst triarylamine structure) | J. Lumin. 72-74, 985 (1997) |
| $CF_x$ Fluorohydrocarbon polymer | $-(CH_xF_y)_n-$ | Appl. Phys. Lett. 78, 673 (2001) |
| Conducting polymers (e.g., PEDOT:PSS, polyaniline, polypthiophene) | (PEDOT + PSS structure) | Synth. Met. 87, 171 (1997) |
| Arylamines complexed with metal oxides such as molybdenum and tungsten oxides | (arylamine structure) + $MoO_x$ | SID Symposium Digest, 37, 923 (2006) |

TABLE 1-continued

| MATERIAL | EXAMPLES OF MATERIAL | PUBLICATIONS |
|---|---|---|
| Hole transporting materials | | |
| Triarylamines (e.g., TPD, α-NPD) | | Appl. Phys. Lett. 51, 913 (1987) |
| | | US5061569 |
| | | EP650955 |
| | | J. Mater. Chem. 3, 319 (1993) |

TABLE 1-continued
| MATERIAL | EXAMPLES OF MATERIAL | PUBLICATIONS |
|---|---|---|
| | 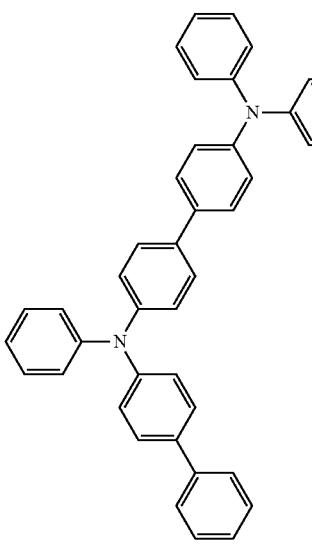 | Appl. Phys. Lett. 90, 183503 (2007) |
| | 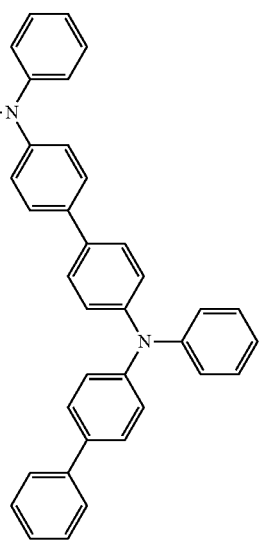 | Appl. Phys. Lett. 90, 183503 (2007) |
| Triaylamine on spirofluorene core | 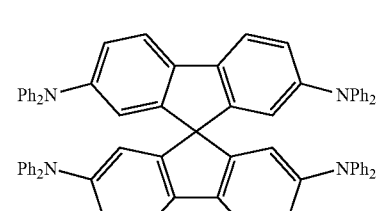 | Synth. Met. 91, 209 (1997) |

TABLE 1-continued
| MATERIAL | EXAMPLES OF MATERIAL | PUBLICATIONS |
|---|---|---|
| Arylamine carbazole compounds | 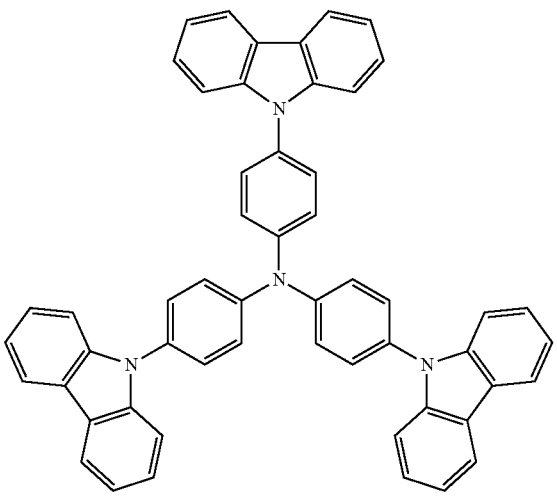 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994) |
| Indolocarbazoles | 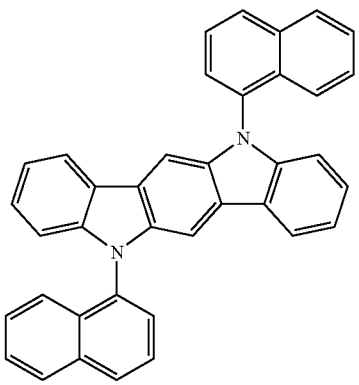 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 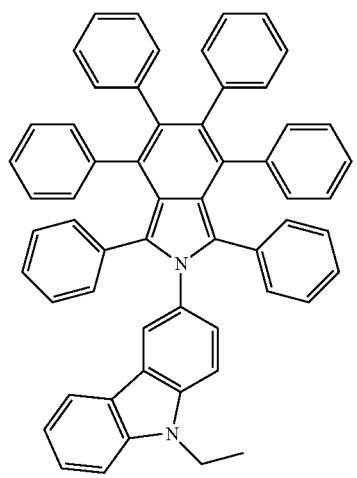 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |

TABLE 1-continued

| MATERIAL | EXAMPLES OF MATERIAL | PUBLICATIONS |
|---|---|---|
| Phosphorescent OLED host materials Red hosts | | |
| Arylcarbazoles | | Appl. Phys. Lett. 78, 1622 (2001) |
| Metal 8-hydroxy-quinolates (e.g., Alq$_3$, BAlq) | | Nature 395, 151 (1998) |
| | | US20060202194 |
| | | WO2005014551 |
| Metal phenoxy-benzothiazole compounds | | Appl. Phys. Lett. 90, 123509 (2007) |
| Conjugated oligomers and polymers (e.g., polyfluorene) | | Org. Electron. 1, 15 (2000) |

TABLE 1-continued
| MATERIAL | EXAMPLES OF MATERIAL | PUBLICATIONS |
|---|---|---|
| Green hosts | | |
| Aryl-carbazoles | 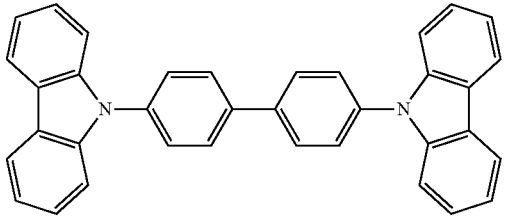 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 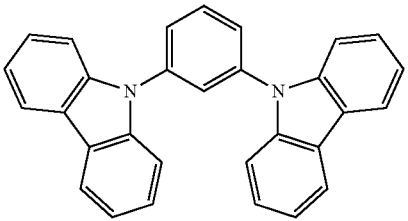 [SMILES: c1cc(-n2c3ccccc3c3ccccc32)cc(-n2c3ccccc3c3ccccc32)c1] | US2003175553 |
| | 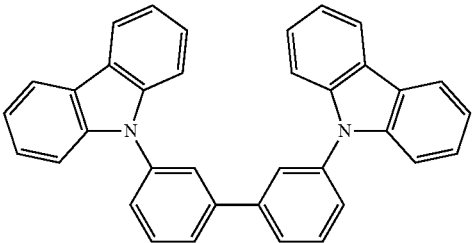 [SMILES: c1cc(-c2cccc(-n3c4ccccc4c4ccccc43)c2)cc(-n2c3ccccc3c3ccccc32)c1] | WO2001039234 |
| Aryl-triphenylene compounds | 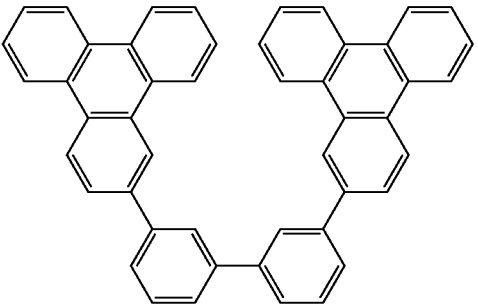 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 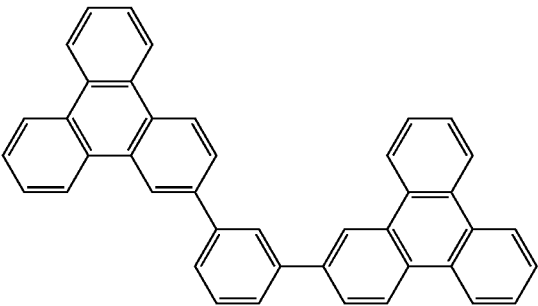 [SMILES: c1cc(-c2ccc3c4ccccc4c4ccccc4c3c2)cc(-c2ccc3c4ccccc4c4ccccc4c3c2)c1] | US20060280965 |
| Polymers (e.g., PVK) | 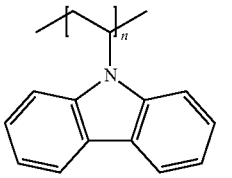 | Appl. Phys. Lett. 77, 2280 (2000) |

TABLE 1-continued
| MATERIAL | EXAMPLES OF MATERIAL | PUBLICATIONS |
|---|---|---|
| Spiro-fluorene compounds | 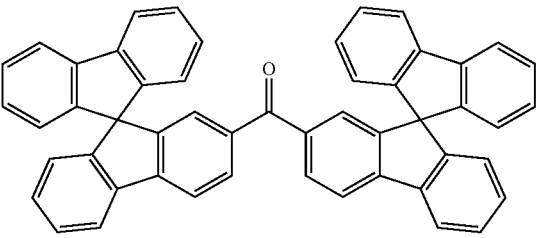 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxy-benzooxazole compounds | 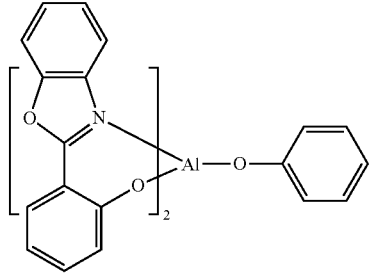 | WO05089025 |
| | 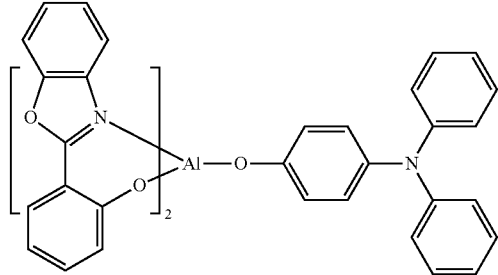 | WO06132173 |
| | 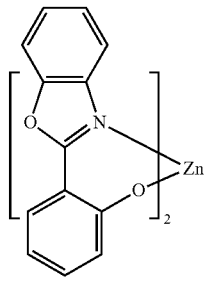 | JP200511610 |
| Spiro-fluorene-carbazole compounds | 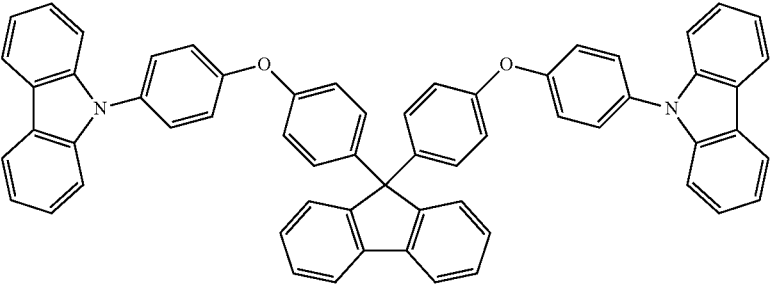 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |

TABLE 1-continued

| MATERIAL | EXAMPLES OF MATERIAL | PUBLICATIONS |
|---|---|---|
| | | JP2007254297 |
| Indolocabazoles | | WO07063796 |
| | | WO07063754 |
| 5-member ring electron deficient heterocycles (e.g., triazole, oxadiazole) | | J. Appl. Phys. 90, 5048 (2001) |
| | | WO04107822 |

TABLE 1-continued

| MATERIAL | EXAMPLES OF MATERIAL | PUBLICATIONS |
|---|---|---|
| Metal phenoxy-pyridine compounds | | WO05030900 |
| Blue hosts | | |
| Aryl-carbazoles | | Appl. Phys. Lett, 82, 2422 (2003) |
| | | US20070190359 |
| Dibenzo-thiophene-carbazole compounds | | WO2006114966 |
| Phosphorescent dopants | | |
| Red dopants | | |
| Heavy metal porphyrins (e.g., PtOEP) | | Nature 395, 151 (1998) |

TABLE 1-continued
| MATERIAL | EXAMPLES OF MATERIAL | PUBLICATIONS |
|---|---|---|
| Iridium(III) organometallic complexes | 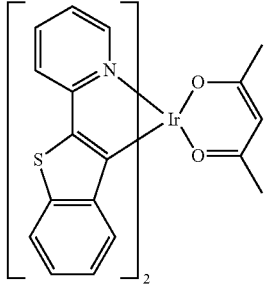 | Appl. Phys. Lett. 78, 1622 (2001) |
| | 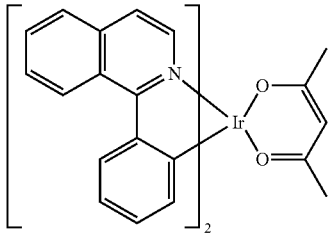 | US06835469 |
| | 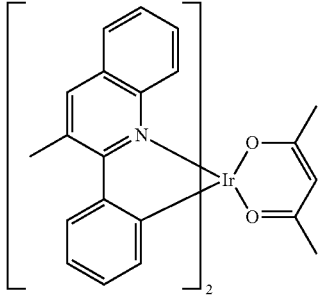 | US06835469 |
| | 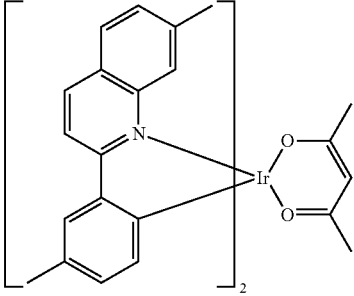 | US20060202194 |
| | 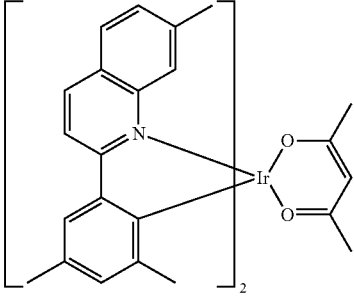 | US20060202194 |

TABLE 1-continued
| MATERIAL | EXAMPLES OF MATERIAL | PUBLICATIONS |
|---|---|---|
|  | 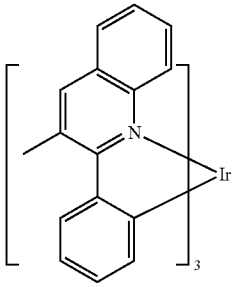 | US07087321 |
|  | 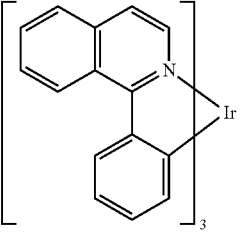 | US07087321 |
|  | 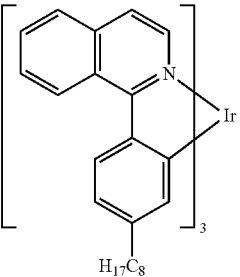 | Adv. Mater. 19, 739 (2007) |
| Platinum(II) organometallic complexes | 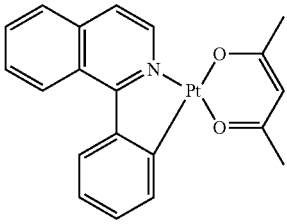 | WO2003040257 |
| Osminum(III) complexes | 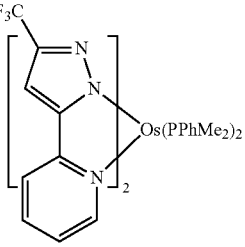 | Chem. Mater. 17, 3532 (2005) |
| Ruthenium(II) complexes | 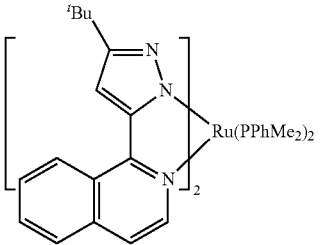 | Adv. Mater. 17, 1059 (2005) |

TABLE 1-continued
| MATERIAL | EXAMPLES OF MATERIAL | PUBLICATIONS |
|---|---|---|
| Green dopants | | |
| Iridium(III) organometallic complexes | 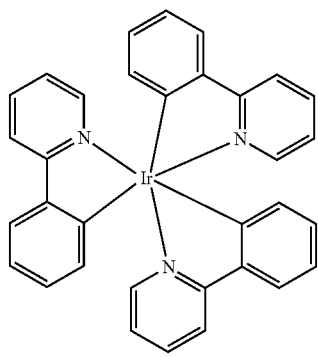 and its derivatives | Inorg. Chem. 40, 1704 (2001) |
| | 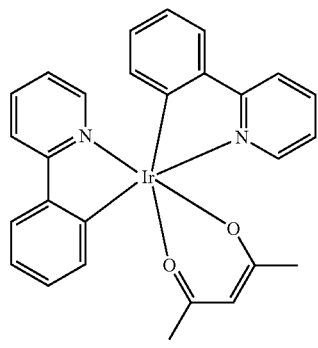 | US2002034656 |
| | 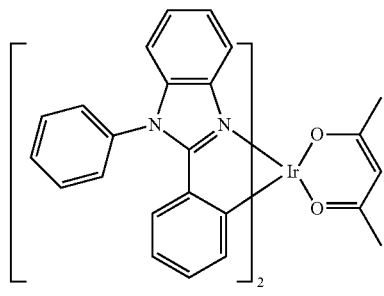 | US06687266 |
| | 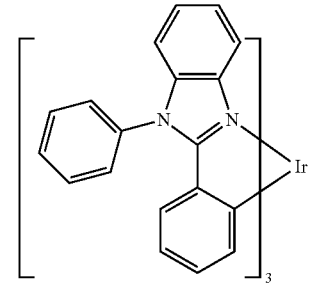 | Chem. Mater. 16, 2480 (2004) |

TABLE 1-continued

| MATERIAL | EXAMPLES OF MATERIAL | PUBLICATIONS |
|---|---|---|
| | | US2007190359 |
| | | US 2006008670<br>JP2007123392 |
| | | Adv. Mater.<br>16, 2003<br>(2004) |
| | | Angew. Chem.<br>Int. Ed.<br>2006, 45, 7800 |
| Pt(II) organometallic complexes | | Appl. Phys.<br>Lett. 86,<br>153505 (2005) |

TABLE 1-continued

| MATERIAL | EXAMPLES OF MATERIAL | PUBLICATIONS |
|---|---|---|
| | | Appl. Phys. Lett. 86, 153505 (2005) |
| | | Chem. Lett. 34, 592 (2005) |
| Gold complexes | | Chem. Commun. 2906 (2005) |
| Rhenium(III) complexes | | Inorg. Chem. 42, 1248 (2003) |
| Blue dopants | | |
| Iridium(III) organometallic complexes | | WO2002002714 |

TABLE 1-continued

| MATERIAL | EXAMPLES OF MATERIAL | PUBLICATIONS |
|---|---|---|
| | | WO2006009024 |
| | | US2006251923 |
| | | WO2006056418, US2005260441 |
| | | US2007190359 |
| | | US2002134984 |
| | | Angew. Chem. Int. Ed. 47, 1 (2008) |

TABLE 1-continued
| MATERIAL | EXAMPLES OF MATERIAL | PUBLICATIONS |
|---|---|---|
| | 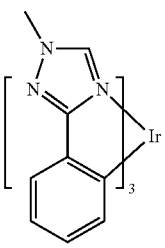 | Chem. Mater. 18, 5119 (2006) |
| | 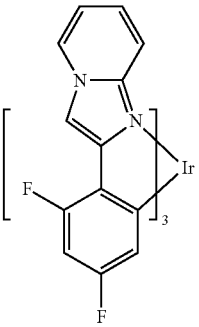 | Inorg. Chem. 46, 4308 (2007) |
| | 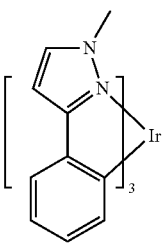 | WO05123873 |
| | 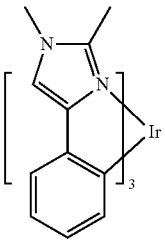 | WO05123873 |
| | 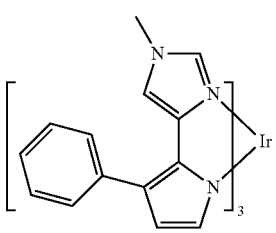 | WO07004380 |

TABLE 1-continued

| MATERIAL | EXAMPLES OF MATERIAL | PUBLICATIONS |
|---|---|---|
| | [Ir complex structure] | WO06082742 |
| Osmium(II) complexes | [Os complex structure] | US2005260449 |
| | [Os(PPh₃) complex structure] | Organometallics 23, 3745 (2004) |
| Gold complexes | [Au-Au dppm complex structure] | Appl. Phys. Lett. 74, 1361 (1999) |
| Platinum(II) complexes | [Pt complex structure] | WO06098120, WO06103874 |

TABLE 1-continued
| MATERIAL | EXAMPLES OF MATERIAL | PUBLICATIONS |
|---|---|---|
| Exciton/hole blocking layer materials | | |
| Bathocuprine compounds (e.g., BCP, BPhen) | 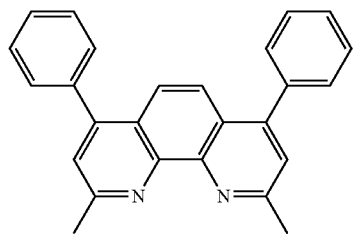 [SMILES: Cc1cc(-c2ccccc2)c2ccc3c(-c4ccccc4)cc(C)nc3c2n1] | Appl. Phys. Lett. 75, 4 (1999) |
| | 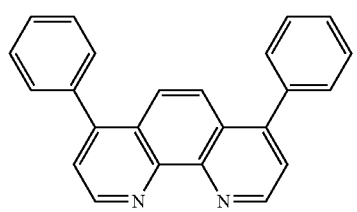 | Appl. Phys. Lett. 79, 449 (2001) |
| Metal 8-hydroxy-quinolates (e.g., BAlq) | 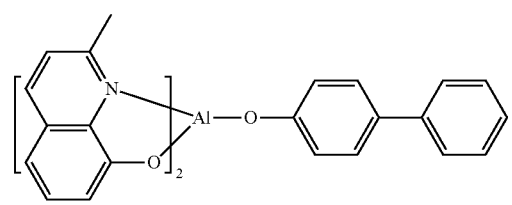 | Appl. Phys. Lett. 81, 162 (2002) |
| 5-member ring electron deficient heterocycles such as triazole, oxadiazole, imidazole, benzoimidazole | 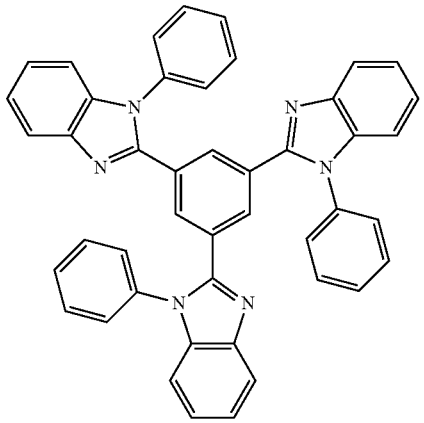 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 1-continued
| MATERIAL | EXAMPLES OF MATERIAL | PUBLICATIONS |
|---|---|---|
| Triphenylene compounds | 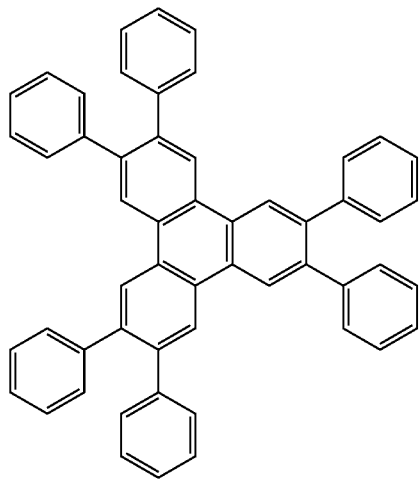 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 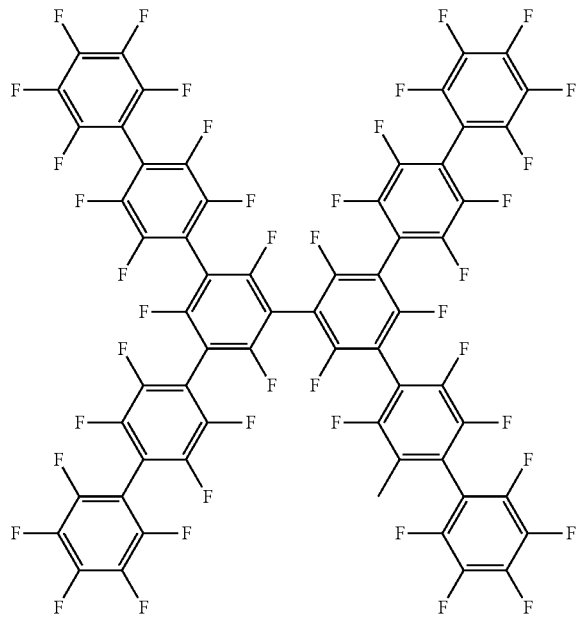 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |

TABLE 1-continued

| MATERIAL | EXAMPLES OF MATERIAL | PUBLICATIONS |
|---|---|---|
| Electron transporting materials | | |
| Anthracene-benzoimidazole compounds | | WO03060956 |
| Anthracene-benzothiazole compounds | | Appl. Phys. Lett. 89, 063504 (2006) |
| Metal 8-hydroxyquinolates (e.g., Alq$_3$) | | Appl. Phys. Lett. 51, 913 (1987) |
| Metal hydroxybenoquinolates | | Chem. Lett. 5, 905 (1993) |
| Bathocuprine compounds such as BCP, BPhen, etc | | Appl. Phys. Lett. 91, 263503 (2007) |

TABLE 1-continued
| MATERIAL | EXAMPLES OF MATERIAL | PUBLICATIONS |
|---|---|---|
| | 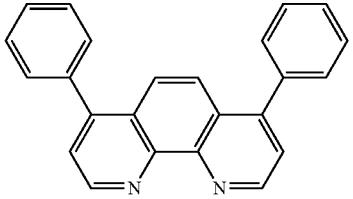 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimidazole) | 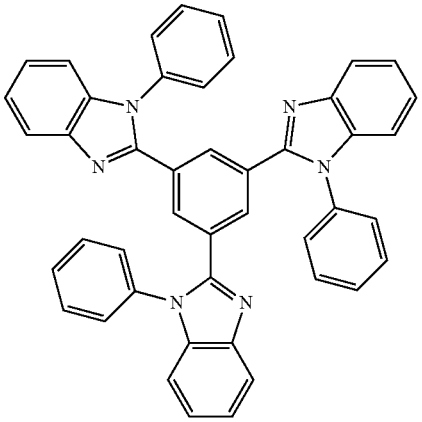 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 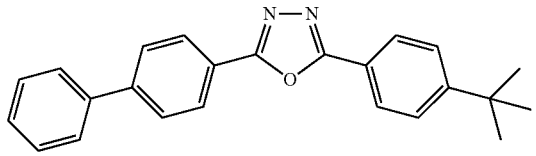 [SMILES: CC(C)(C)c1ccc(-c2nnc(-c3ccc(-c4ccccc4)cc3)o2)cc1] | Appl. Phys. Lett. 55, 1489 (1989) |
| | 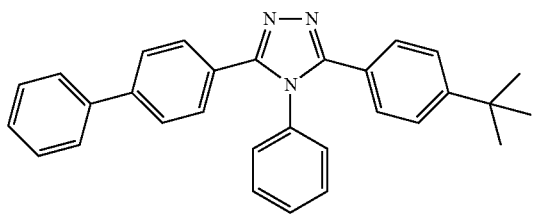 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 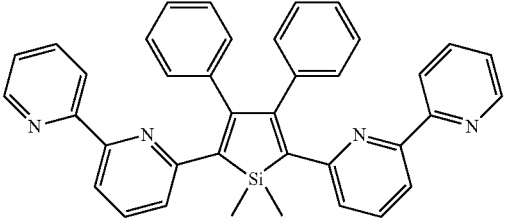 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 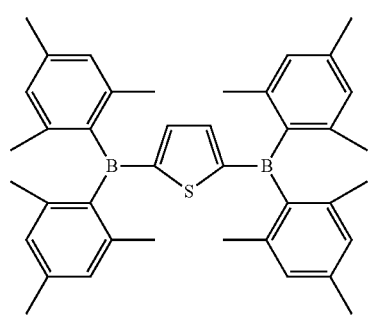 | J. Am. Chem. Soc. 120, 9714 (1998) |

TABLE 1-continued

| MATERIAL | EXAMPLES OF MATERIAL | PUBLICATIONS |
|---|---|---|
| Fluorinated aromatic compounds | | J. Am. Chem. Soc. 122, 1832 (2000) |

As used herein, the following Compounds refer to materials having the following structure:

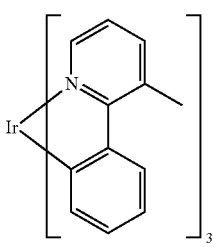

Compound A

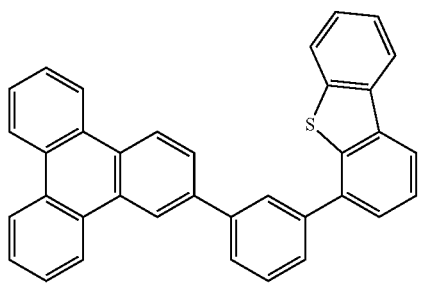

Compound B

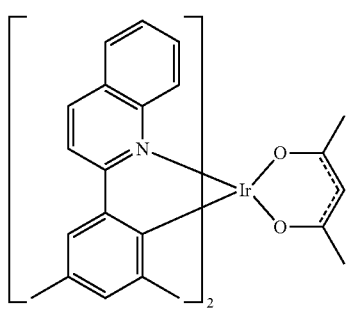

Compound C

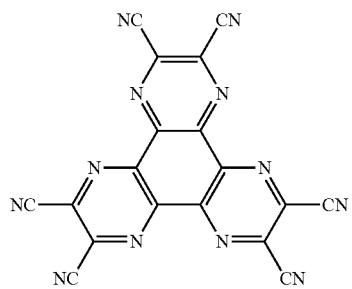

Compound D

LG-201 a compound available for purchase from LG Chemicals of Korea. "NPD" refers to N,N'-di(1-naphthyl)-N, N'-diphenylbenzidine. "Alq$_3$" refers to tris(8-hydroxyquinoline)aluminum. BAlq refers to aluminum(III)bis(2-methyl-8-quinolinato)4-phenylphenolate.

EXPERIMENTAL

The lifetime of green and red phosphorescent OLEDs with a triarylamine HTL (NPD) have been improved more than 2× by doping 2% of a metal quinolate (Alq) into the HTL, as compared to an undoped NPD HTL reference device. All doping percentages are in wt %. All measurements reported in Tables 2, 3 and 4 were performed in a room temperature environment. The improvement in the device lifetime may be attributed to the quenching of NPD excited state molecules formed due to electrons or excitons leaking into the NPD HTL from the EML. Doped HTL was shown to work both in green and red phosphorescent OLEDs without contamination of the device EL spectra, showing that a doped HTL is suitable for use in common layer architectures for R, G, B OLEDs.

The experimental data are shown in Tables 2 and 3. Table 2 shows the data for a green phosphorescent OLED having the structure shown in FIG. 5, which specifies all materials except for the HTL. The HTL material is provided in Table 2. Green phosphorescent OLEDs were fabricated using an NPD HTL (Comparative example 1) NPD: 2% Alq$_3$ (Example 1), and NPD: 10% Alq$_3$ (Example 2). The addition of 2% Alq$_3$ dopant into the NPD HTL dramatically improved lifetime (over 2× in terms of the lifetime×luminance squared product [Gnits*h], which is an approximate comparative indicator of device lifetime for devices measured under different luminance output conditions—most OLEDs have an inverse power law dependence of lifetime where luminance lifetime is proportional to 1/luminance$^n$ where n is usually between 1.5 and 2.5), without significantly changing device color, efficiency and voltage. Further increasing the Alq$_3$ dopant concentration in the HTL to 10% extended device lifetime at 40 mA/cm$^2$ even further. However, there was also a significant negative impact on device voltage, efficiency and initial luminance. The tables provides luminous efficacy in candelas/amp, external quantum efficiency in %, power efficiency in lumens per Watt, the time in hours required for the device to decay to 80% of its initial luminance (LT$_{80}$) or 90% of its initial luminance (LT$_{90}$) at an initial luminance L$_0$ measured in nits, where the initial current flux is 40 mA/cm$^2$, and the product of lifetime×luminance$^2$ measured in Gnits$^2$ hours.

TABLE 2

Performance of green phosphorescent OLED with doped HTL

| | | 1931 CIE | | At 1000 nits | | | | At 40 mA/cm² | | |
|---|---|---|---|---|---|---|---|---|---|---|
| Ex. | HTL | x | y | V [V] | LE cd/A | EQE [%] | PE lm/W | $L_0$ nits | $LT_{80\%}$ [h] | Gnits² h |
| Comp. Ex. 1 | NPD | 0.328 | 0.617 | 5.2 | 43.2 | 12.1 | 25.9 | 14,183 | 280 | 56.3 |
| Ex. 1 | NPD:Alq₃ 2% | 0.327 | 0.617 | 5.5 | 38 | 10.7 | 21.9 | 12,490 | 800 | 124.8 |
| Ex. 2 | NPD:Alq₃ 10% | 0.325 | 0.615 | 6.6 | 28.5 | 8.1 | 13.6 | 9,314 | 1200 | 104.1 |

Alq₃ is a green emitter and it is possible that generally undesirable emission from Alq₃ in the HTL would not be visible in a green phosphorescent OLED. For this reason, a red-emitting device with a BAlq:Compound C EML was fabricated on NPD HTL (Comparative example 2), NPD: 2% Alq₃ (Example 3), and NPD: 5% Alq₃ (Example 4). Table 3 shows the data for these red phosphorescent OLEDs, which had the structure shown in FIG. 6, which specifies all materials except for the HTL. The HTL material is provided in Table 3. There was no significant change in the device CIE with introduction of Alq₃ dopant into NPD HTL at concentrations of up to 5 wt %. The device performance does not change significantly. These results show that NPD doped with Alq₃ can be used as an HTL in devices emitting colors other than green.

In addition, the effect of dopant concentration on changes in measured voltage, efficiency and initial luminance results is not expected to change significantly due to device color. Thus, Tables 2 and 3, taken together, show that dopant concentrations up to 5 wt % can be used to increase device lifetime without a significant negative impact on voltage, efficiency and initial luminance, while higher dopant concentrations, such as 10 wt %, may have a significant negative impact. Based on the reasons these materials were selected, i.e., their hole and electron transport properties, it is believed that the conclusions may reasonably be extended to electron and hole transport materials generally.

TABLE 3

Performance of red phosphorescent OLEDs with doped HTL

| | | 1931 CIE | | At 1000 nits | | | | At 40 mA/cm² | | |
|---|---|---|---|---|---|---|---|---|---|---|
| Ex. | HTL | x | y | V [V] | LE cd/A | EQE [%] | PE lm/W | $L_0$ nits | $LT_{90\%}$ [h] | Gnits² h |
| Comp. Ex. 2 | NPD | 0.668 | 0.330 | 5.4 | 13.4 | 13.4 | 7.8 | 4,549 | 256 | 5.3 |
| Ex. 3 | NPD:Alq₃ 2% | 0.667 | 0.330 | 5.4 | 13.5 | 13.5 | 7.8 | 4,578 | 240 | 5.0 |
| Ex. 4 | NPD:Alq₃ 5% | 0.667 | 0.330 | 5.5 | 13.5 | 13.5 | 7.8 | 4,528 | 206 | 4.2 |

TABLE 4

Performance of green phosphorescent OLEDs with doped HTL

| | | 1931 CIE | | At 1,000 nits | | | | At 40 mA/cm² | | |
|---|---|---|---|---|---|---|---|---|---|---|
| Ex. | HTL | x | y | V | LE cd/A | EQE % | PE lm/W | $L_0$ nits | $LT_{80\%}$ h | Gnits² h |
| Comp. Ex. 3 | 300 Å NPD | 0.330 | 0.620 | 6.6 | 52.1 | 14.6 | 24.7 | 13,876 | 420 | 80.87 |
| Ex. 5 | 300 Å NPD:LG201 2% | 0.327 | 0.619 | 6.9 | 46.4 | 13 | 21.1 | 13,325 | 680 | 120.74 |
| Ex. 6 | 300 Å NPD:LG201 5% | 0.327 | 0.620 | 6.9 | 44.2 | 12.4 | 20.2 | 12,882 | 680 | 112.84 |
| Ex. 7 | 150 Å NPD/ 150 Å NPD:LG201 2% | 0.327 | 0.620 | 7 | 44.8 | 12.5 | 20.2 | 12,839 | 850 | 140.11 |
| Ex. 8 | 150 Å NPD/ 150 Å NPD: | 0.327 | 0.618 | 6.9 | 46.4 | 13.1 | 21.3 | 13,183 | 830 | 144.25 |

TABLE 4-continued

Performance of green phosphorescent OLEDs with doped HTL

| | | 1931 CIE | | At 1,000 nits | | | At 40 mA/cm² | |
| | | | | LE | PE | L₀ | LT₈₀% |
| Ex. | HTL | x | y | V | cd/A | EQE % | lm/W | nits | h | Gnits² h |
| | LG201 5% | | | | | | | | | |

Table 4 shows the data for a green phosphorescent OLED having the structure shown in FIG. 7, which specifies all materials except for the HTL. The HTL material is provided in Table 4. Green phosphorescent OLEDs were fabricated using an NPD HTL doped with LG-201 at 2 and 5 wt % (examples 5 and 6), which were shown to be more stable than comparative example 3, which has an undoped NPD HTL. Devices examples 7 and 8 have a split HTL: 150 Å undoped NPD and 150 Å NPD doped with LG-201, where the doped region is close to EML layer. These devices are also more stable than comparative Example 3 reference device. The data of Table 4 extends the results provided in Tables 2 and 3 to a dopant material, LG201, that is known to be a good electron transport material, and is not believed to be a metal quinolate.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. An organic light emitting device, comprising:
   (a) an anode
   (b) a cathode
   (c) a first organic layer disposed between the anode and the cathode, the first organic layer being an emissive layer comprising a first organic emitting material;
   (d) a second organic layer disposed between the anode and the first organic layer and in direct contact with the first organic layer, the second organic layer being a non-emissive layer, the second organic layer comprising:
      (i) an organic small molecule hole transport material having a concentration of 50 to 99 wt %;
      (ii) an organic small molecule electron transport material having a concentration of 0.1 to 5 wt %;
   wherein the concentration of the 0.1 to 5 wt % of the organic small molecule electron transport material occurs at a position in the second organic layer immediately on the anode side of the emissive layer.

2. The device of claim 1, wherein the organic small molecule electron transport material has a concentration of 0.1 to 4 wt % in the second organic layer.

3. The device of claim 1, wherein the organic small molecule electron transport material has a concentration of 0.1 to 3 wt % in the second organic layer.

4. The device of claim 1, wherein the organic small molecule electron transport material has a concentration of 2 to 3 wt % in the second organic layer.

5. The device of claim 1, further comprising a third organic layer disposed between the second organic layer and die anode, the third organic layer comprising a hole injection material;
   (a) wherein the third organic layer is in direct contact with the anode, and
   (b) wherein the third organic layer is in direct contact with the second organic layer.

6. The device of claim 1, further comprising another organic layer disposed between the first organic layer and the cathode, the another organic layer being an emissive layer comprising a second emitting material.

7. The device of claim 1, further comprising an additional organic layer disposed between the second organic layer and the anode, the additional organic layer comprising the organic small molecule hole transport material, and not including the organic small molecule electron transport material.

8. The device of claim 1, wherein the organic small molecule electron transport material has a HOMO-LUMO difference that is at least 0.2 eV less than the HOMO-LUMO difference of the organic small molecule hole transport material.

9. The device of claim 1, wherein the organic small molecule electron transport material has a LUMO energy level that is at least 0.2 eV less than the LUMO energy level of the organic small molecule hole transport material.

10. The device of claim 1, wherein the first organic emitting material is phosphorescent.

11. The device of claim 10, wherein the emitting material has a peak emissive wavelength in the visible spectrum of 600 to 700 nm.

12. The device of claim 10, wherein the emitting material has a peak emissive wavelength in the visible spectrum of 500 to 600 nm.

13. The device of claim 10, wherein the emitting material has a peak emissive wavelength in the visible spectrum of 400 to 500 nm.

14. The device of claim 1, wherein the organic small molecule electron transport material is a metal quinolate.

15. The device of claim 14, wherein the organic small molecule electron transport material is $Alq_3$.

16. The device of claim 1, wherein the organic small molecule hole transport material is an amine-containing material.

17. The device of claim 16, wherein the organic small molecule hole transport material is NPD.

18. The device of claim 1, wherein the organic small molecule electron transport material has an electron mobility higher than that of the organic small molecule hole transport material.

* * * * *